(12) United States Patent
Frank et al.

(10) Patent No.: US 9,130,002 B2
(45) Date of Patent: Sep. 8, 2015

(54) DEVICE FOR HOLDING WAFER SHAPED ARTICLES

(75) Inventors: Dieter Frank, Lind ob Velden (AT); Michael Puggl, Eitweg (AT); Roman Fuchs, Villach (AT); Otto Lach, Treffen (AT)

(73) Assignee: LAM RESEARCH AG, Villach (AT)

( * ) Notice: Subject to any disclaimer, the term of this patent is extended or adjusted under 35 U.S.C. 154(b) by 678 days.

(21) Appl. No.: 12/775,992

(22) Filed: May 7, 2010

(65) Prior Publication Data

US 2011/0272874 A1 Nov. 10, 2011

(51) Int. Cl.
*H01L 21/687* (2006.01)

(52) U.S. Cl.
CPC .... *H01L 21/68785* (2013.01); *H01L 21/68728* (2013.01); *H01L 21/68792* (2013.01)

(58) Field of Classification Search
CPC .................. H01L 21/68785; H01L 21/68792; H01L 21/68728; Y10S 269/903; B25B 5/006; Y10T 29/53961; Y10T 29/49998
USPC ......... 269/903, 289 R, 302.1, 55, 60, 254 CS
See application file for complete search history.

(56) References Cited

U.S. PATENT DOCUMENTS

| | | | | |
|---|---|---|---|---|
| 4,903,717 A | * | 2/1990 | Sumnitsch | 134/99.1 |
| 4,989,345 A | * | 2/1991 | Gill, Jr. | 34/58 |
| 5,046,909 A | * | 9/1991 | Murdoch | 294/113 |
| 5,052,092 A | * | 10/1991 | Vallauri et al. | 29/234 |
| 5,513,668 A | * | 5/1996 | Sumnitsch | 134/157 |
| 5,860,181 A | * | 1/1999 | Maekawa et al. | 15/102 |
| 6,540,014 B2 | * | 4/2003 | Getchel et al. | 165/80.1 |
| 6,702,900 B2 | * | 3/2004 | Yeh et al. | 118/730 |
| 8,292,279 B2 | * | 10/2012 | Zhang | 269/107 |
| 2002/0153676 A1 | | 10/2002 | Noguchi | |

FOREIGN PATENT DOCUMENTS

| | | |
|---|---|---|
| JP | 459155 U | 5/1992 |
| JP | 07035395 Y | 8/1995 |
| JP | 11251414 A | 9/1999 |
| KR | 20040035424 A | 4/2004 |
| KR | 100876100 B1 | 12/2008 |
| KR | 100949256 B1 | 3/2010 |

OTHER PUBLICATIONS

International Search Report dated Feb. 8, 2012, from corresponding PCT application.
Written Opinion dated Nov. 13, 2012, from corresponding PCT application.
Chinese Office Action dated Mar. 20, 2015, from corresponding Chinese application.

* cited by examiner

*Primary Examiner* — Lee D Wilson
*Assistant Examiner* — Adam Barlow
(74) *Attorney, Agent, or Firm* — Young & Thompson

(57) ABSTRACT

A spin chuck for holding semiconductor wafers includes one or more damping mechanisms to limit the force with which chuck pins impact the wafer edge following wafer shift. The damping mechanism may be a linear or rotary dashpot. The dashpot or dashpots are mounted on a surface of the chuck body and include a control arm that contacts a common gear ring that in turn drives the chuck pins during radially inward and outward movement.

19 Claims, 3 Drawing Sheets

US 9,130,002 B2

DEVICE FOR HOLDING WAFER SHAPED ARTICLES

BACKGROUND OF THE INVENTION

The invention relates to devices for holding wafer-shaped articles, such as semiconductor wafers.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

The patents referenced above operate on the Bernoulli principle, such that the wafer receives subjacent support from a gas cushion rather than by contact with the chuck. Such chucks nevertheless ordinarily include a circular series of pins that are positioned radially outwardly of a wafer positioned on the chuck. Those pins prevent lateral displacement of the wafer relative to the chuck.

As described in U.S. Pat. No. 4,903,717, it is also advantageous to construct the pins such that each projects upwardly from a respective pivotal base. The axes of the pin and base are vertical but offset from one another such that pivoting of the base causes the associated pin to travel along a circular arc and hence be adjustable in its radial position. The pivot bases are each provided with gear teeth, which mesh with the teeth of a common gear ring that is coaxial with the axis of rotation of the chuck. Rotation of the gear ring relative to the chuck thus causes all of the pins to move conjointly and to the same extent.

That construction permits the pins to be moved radially outwardly for placement or removal of a wafer, and then to be moved radially inwardly to be brought into contact with the peripheral edge of a wafer. Such contact prevents not only lateral displacement of the wafer relative to the chuck, but also relative rotation between the wafer and chuck as the chuck is spun.

Rotation of the wafer relative to the chuck is referred to as "wafer shift." Whereas the wafer and chuck are generally not intended to move relative to one another, a controlled amount of wafer shift is desirable to ensure correct cleaning and/or etching of the wafer bevel in the area where the pins touch wafer. This involves shifting the wafer by several degrees relative to the chuck during the cleaning as well as etching step. The wafer shift is carried out in a specific time interval. Within this time interval the gear ring inside of the chuck opens the pins of the chuck and the wafer is shifted. The gear ring is moved back by spring forces.

In spin chucks utilized in process modules for single wafer wet processing, such as those made by Lam Research Corporation, wafer shift can be performed by accelerating or decelerating the chuck during the process steps. That is, the inertia of the gear ring, which drives the chuck pins, is such that there is slight relative rotation between the gear ring and the chuck body during acceleration and deceleration of the chuck, which causes the pins to undergo an opening and closing movement and release the wafer for several milliseconds as the chuck is accelerated or decelerated. During that interval the wafer is not clamped and rotates by several degrees relative to the chuck. Similarly, if the tooth gear is driven instead of the chuck base body the relative movement of the chuck base body against the tooth gear is caused by the inertia of the chuck base body, with the same effect on the chuck pins.

SUMMARY OF THE INVENTION

The present inventors have discovered that, in chucks of the type described above, the pins close very rapidly, which causes excessive wear and groove formation in the pins over time. This can result in decreasing the working lifetime of the chuck, and impairing the desired controlled wafer shift during wafer processing.

According to the present invention, a device for holding wafer-shaped articles, such as semiconductor wafers, is equipped with a damping mechanism that controls the force with which the contact elements of the device impact the workpiece. A preferred embodiment of the present invention is a spin chuck, and especially a spin chuck within a process module for single wafer wet processing, in which the damping mechanism controls and limits the force, with which the chuck pins impact the wafer periphery when the pins resume contact with the wafer following wafer shift.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
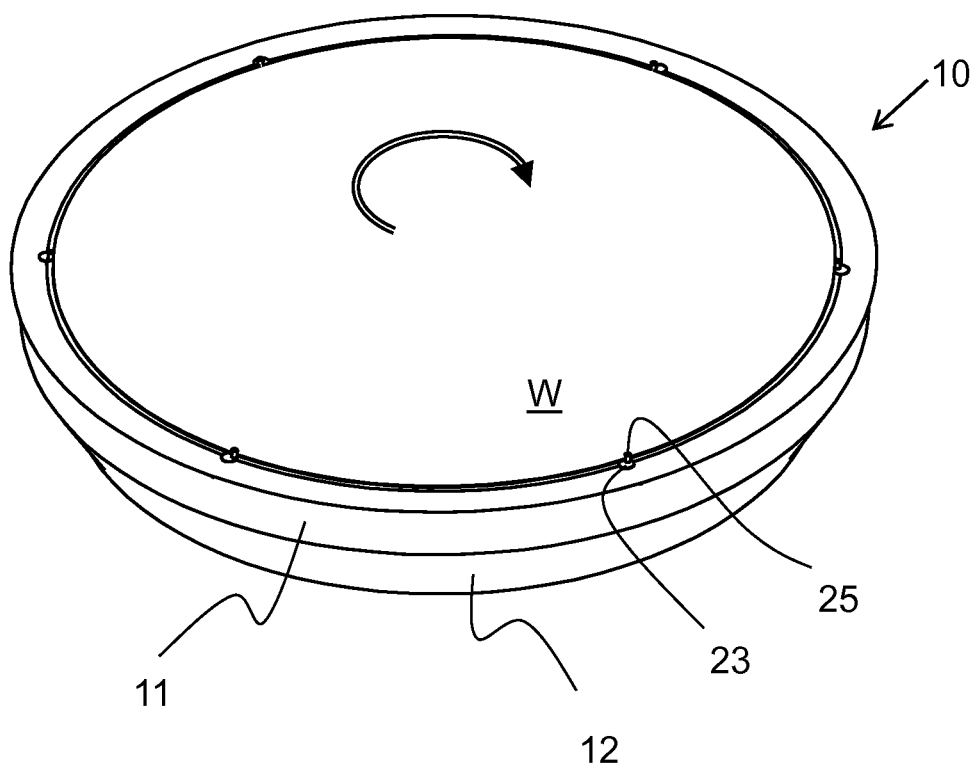
FIG. 1 is a schematic perspective view from above of a chuck according to an embodiment of the invention, with a wafer in position.

In FIG. 1, a chuck 10 is in a working position, which means that a wafer W is held by the pins 25. The circular arrow depicts the clockwise rotation of the chuck. Chuck 10 includes an upper base body 11 and a lower base body 12. The wafer is held peripherally by a series of pin assemblies 23, each including an eccentrically mounted chuck pin 25. As discussed above, when the pin assembly 23 is rotated about its axis (parallel to the rotation axis of the chuck) the pin 25 is moved towards and away from the wafer edge.

Chuck 10 is preferably a Bernoulli chuck, where the wafer floats on a gas cushion provided by a number of gas nozzles (not shown) and is also supported from below by the gas cushion due to the Bernoulli effect.

In FIG. 2 the circular arrow again depicts the clockwise rotation of the chuck, although the arrow itself is directed counterclockwise due to the chuck being shown from below in this figure. For ease of illustration the lower base body 12 is not shown. Thus, in FIG. 2 there is visible not only the upper base body 11 and the pin assemblies 23, but also the ring gear 30, whose teeth 37 are in meshing engagement with the teeth 27 formed on the lower portion of each pin assembly 23.

Figure 2:
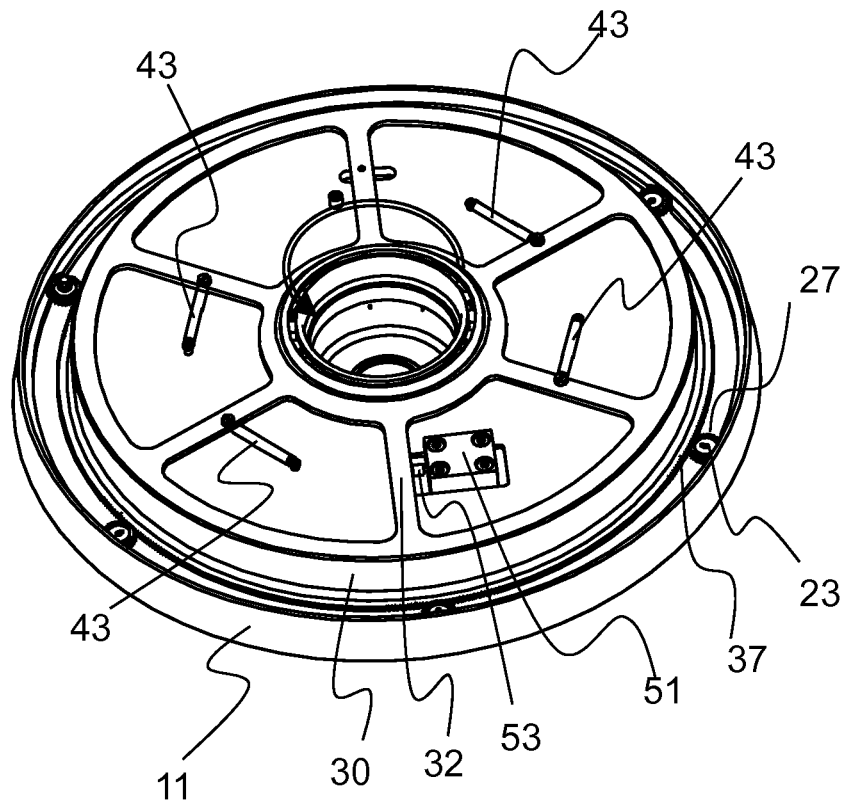
FIG. 2 is a schematic perspective view from below of the chuck of FIG. 1, in which the lower base body has been removed, and corresponding to the state, in which a wafer is being gripped by the chuck pins.

Coil springs 43 are connected at one end to respective spokes 32 of the ring gear 30, and at their opposite ends to the upper base body 11. Springs 43 urge ring gear 30 to rotate relative to the upper base body such that the pin assemblies 23 are pivoted so as to bring pins 25 to their radially inner position, in which they contact the wafer W, the "closed position" as shown in FIGS. 1 and 2.

The chuck base body is connected to a drive shaft (not shown), and when the chuck is driven in the depicted clockwise direction the inertia of the ring gear 30 during acceleration of the chuck will cause the pins 25 to momentarily open, as described above. Conversely, when the chuck is rotated in the counterclockwise direction the chuck must be decelerated in order to momentarily open the pins.

A typical angular acceleration for controlled wafer shift would be 3200 deg/s$^2$.

As discussed above, the present inventors have discovered that, as the gear ring returns from the open position to the closed position during acceleration or deceleration of the chuck, particularly as assisted by the springs 43, the uncontrolled impact of the chuck pins 25 with the peripheral edge of wafer W gradually damages the pins.

To extend the lifetime of the pins and/or get more stable shift performance, a damper system is installed in the chuck. In particular, this embodiment includes a damper 51 mounted to the upper base body 11. The damper comprises a rod 53 that is urged toward a projecting ("armed out") position by a coil spring within the damper. When the chuck is closed, with pins 25 contacting the wafer edge, rod 53 of the damper is in contact with an adjacent spoke 32 of gear ring 30; however, rod 53 is preferably not fixed to spoke 32.

Figure 3:
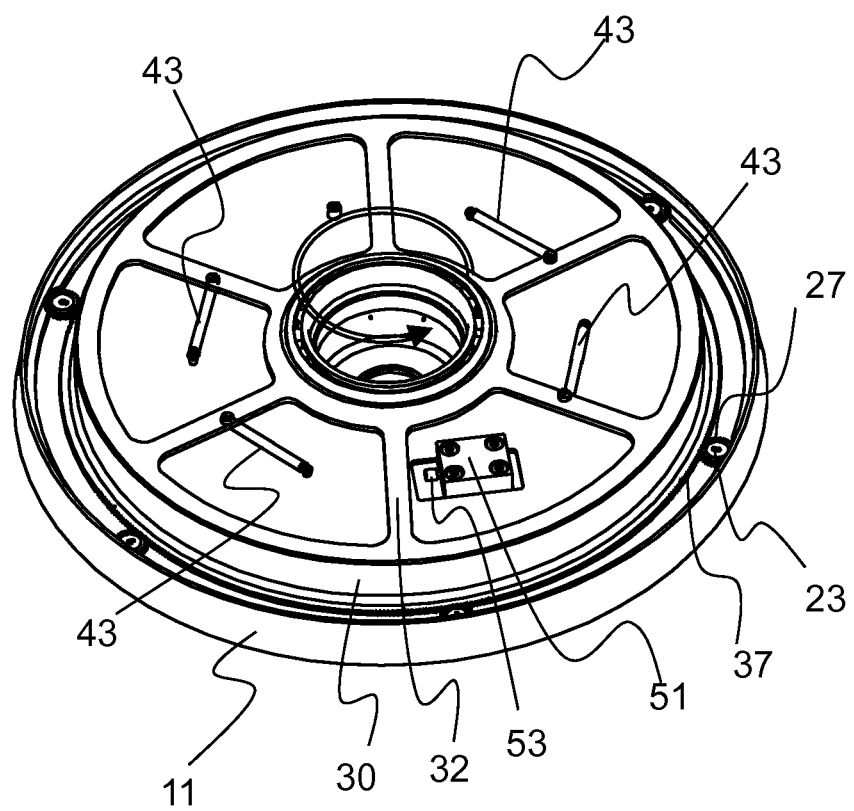
FIG. 3 is a view similar to that of FIG. 2, but corresponding to the state, in which a wafer is not being gripped by the chuck pins.

In FIG. 3 the chuck is in an open position, which means that a wafer is not held by the pins 25 and thus can freely rotate relative to the chuck. The circular arrow in FIG. 3 again depicts an accelerated clockwise rotation of the chuck. Due to the inertia of the ring gear 30 the ring gear 30 is (although still rotating clockwise) rotated counterclockwise with respect to the base body 12 of the chuck 10. This counterclockwise relative motion is carried out against the force of the coil springs 43, which normally urge the ring gear to pivot towards the closed position. Therefore the pin assemblies 23 rotate clockwise for a fraction of a second and the pins 25 release the wafer. FIG. 3 shows the chuck in a position where the chuck has just been accelerated and the tooth gear has not yet followed that acceleration. As can be seen in FIG. 3, the rod 53 of the damper 51 has not yet armed out and thus does not yet contact the spoke 32.

When the tooth gear 30 is drawn back toward the closed position the spoke 32 will touch the rod 53, which will be armed out a little bit already. Consequently the fast movement of the tooth gear following the chuck is then prevented by the rod 53, which will slowly draw in, such that the damper 51 thus limits the velocity of the movement of the tooth gear toward the closed position.

The pin closing step during wafer shift is driven by the inertia of the gear ring and the spring force. In a conventional spin chuck having six chuck pins, the total closing energy, which must be dissipated by the six chuck pins has been determined to be 0.246 Nm. Due to technical considerations it is assumed that this energy is converted to elastic energy, plastic energy and "wear energy" (abrasion of the polymer material of the pins and crack formation).

Furthermore due to the pin bending as well as the high contact force between the wafer and the pins it is possible that multiple wafer shifts during one process are not feasible with conventional spin chucks. The root causes for these multiple wafer shift malfunctions are considered to be deadlocking due to pin bending as well as the high friction force which is created by the high clamping force.

The damper system according to the invention decreases the amount of energy which must be dissipated by the chuck pins. The damper system, which is similar in some respects to a shock absorber, and/or a rotation-brake is installed to decrease or eliminate the closing energy during the wafer shift. The damper is moreover preferably adjustable, and the inventors have determined that the energy dissipated by the damper is more or less a linear function of the "damper stroke." The "damper stroke" and thus the energy which is dissipated by the damper mechanism can be controlled. The presently preferred energy dissipation target range is between 20 and 80% of the theoretical closing energy.

The damping element is designed so that the clamping element closing velocity does not exceed approximately 1 cm/s (0.01 m/s).

A further possibility to decrease as well as to control the wafer shift involves use of a rotation brake. A rotation brake is able to act in both directions. This means that during the opening movement and the closing movement of the ring gear the brake generates a force that opposes movement of the ring gear. By using different rotation brakes as well as different adjustments inside the chuck the brake torque can be adjusted.

Any axial movement of the wafer during wafer-shift can be avoided by using a Bernoulli chuck where the wafer floats on a gas cushion and simultaneously is held by said gas cushion due to the Bernoulli effect. Alternatively any axial movement of the wafer during wafer-shift can be avoided by using scalloped or mushroom-shaped pins.

Figure 4A:
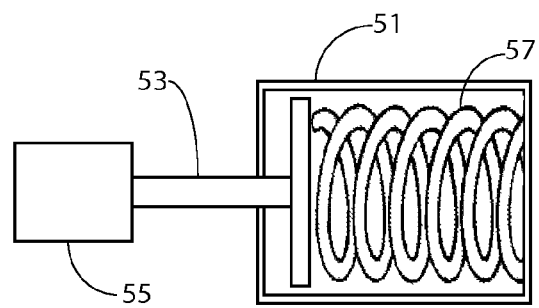
FIG. 4A is a schematic sectional view of the damper mechanism 51 in the open position of the chuck.
Figure 4B:
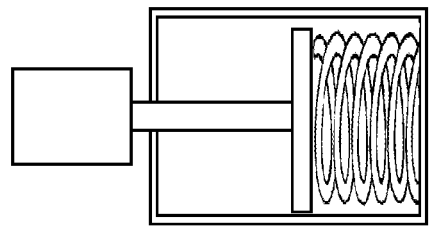
FIG. 4B is a schematic sectional view of the damper mechanism 51 in the closed position of the chuck.

FIGS. 4A and 4B depict the damper mechanism 51 in the open (FIG. 4A) and closed (FIG. 4B) positions of the chuck. Rod 53 is provided with an enlarged head 55 for contacting an adjacent spoke 32 of ring gear 30. Within the housing of damper mechanism 51, the rod 53 bears via an attached plate on a coil spring 57. The spring force of coil spring 57 is less than that of the coil springs 43, so that once the inertia of the gear ring is overcome, the coil spring 57 moves from the relaxed state shown in FIG. 4A to the compressed state as shown in FIG. 4B.

FIGS. 4A and 4B depict a spring acting in compression, but the damper may also include a spring acting in tension, e.g., a spring captive on the rod 53 within the housing of damper mechanism 51, attached at one end to the housing and at the other to the distal end of the rod 53.

Figure 5A:
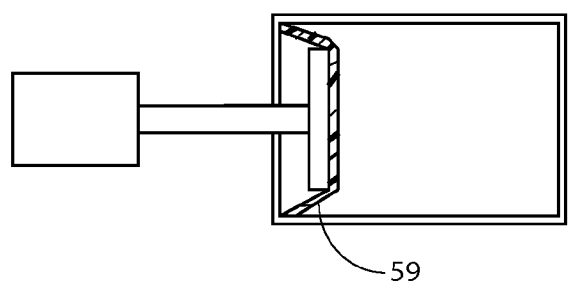
FIG. 5A is a schematic sectional view of an alternative embodiment of the damper mechanism 51 in the open position of the chuck.
Figure 5B:
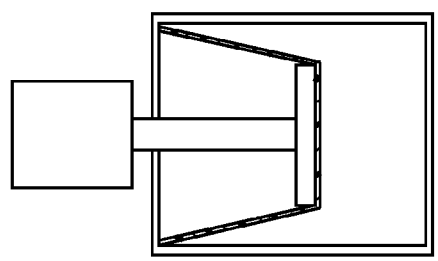
FIG. 5B is a schematic sectional view of an alternative embodiment of the damper mechanism 51 in the closed position of the chuck.

Damping mechanisms other than spring-based devices may also be used. FIGS. 5A and 5B depict an alternative damper mechanism in which a strip or membrane 59 formed from elastic material is used in place of a spring.

Preferably a dashpot (hydraulic damper) is used as the damping mechanism.

Dashpots utilize viscous friction for resisting motion. Dashpots consist of a piston that moves through a viscous fluid in conjunction with a spring, e.g. in shock absorbers. The damping force is proportional to the velocity of the movement. During motion this damping force reacts in the opposite direction. This oppositely directed damping force opposes the motion and absorbs energy.

The two parameters that mainly characterize dashpots are the stroke and the damping coefficient. Linear displacement of the dashpot is measured by the stroke whereas damping force per unit velocity is measured by the damping coefficient.

If a linear dashpot is used the preferred range of the damping coefficient is 2-200 Ns/m, and preferably 6-60 Ns/m (for example 20 Ns/m).

If a rotary dashpot is used the preferred range of the damping coefficient is 0.07-7 Nms/rad (torque per angular velocity), and preferably 0.2-2 Nms/rad (for example 0.7 Nms/rad)—this is the actual damping coefficient at which the tooth gear shall be damped.

FIGS. 2 and 3 depict a single damper mechanism but it is to be understood that plural damper mechanisms may also be used, so as to distribute the braking force more evenly over the periphery of the chuck as well as to permit the use of smaller individual mechanisms and lighter springs. For example, a spin chuck having six pin assemblies could be equipped with one, three or six damper mechanisms.

Although the present invention has been described in connection with spin chucks it may also be used in a non-rotating chuck. Furthermore, although the invention has described in connection with a chuck used for wet chemical processing, it could also be used for dry processes.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A device for holding a wafer-shaped article, comprising clamping elements adapted to contact a peripheral edge of a wafer-shaped article, said clamping elements being biased toward a closed position by an actuating mechanism that engages said clamping elements, and at least one damping mechanism configured to contact said actuating mechanism as said clamping elements are moved toward said closed position, thereby to control a force with which said clamping elements impact the wafer edge when moving to the closed position, and wherein the clamping elements are a series of pins that are conjointly movable from an outer open position in which the pins do not contact a wafer-shaped article to said closed position.

2. A device for holding a wafer-shaped article, comprising clamping elements adapted to contact a peripheral edge of a wafer-shaped article, said clamping elements being biased toward a closed position by an actuating mechanism that engages said clamping elements, and at least one damping mechanism configured to contact said actuating mechanism as said clamping elements are moved toward said closed position, thereby to control a force with which said clamping elements impact the wafer edge when moving to the closed position, and wherein said device is a spin chuck in a process module for single wafer wet processing.

3. The device according to claim 1, wherein the pins are arranged in a circular series, and each pin projects upwardly from a respective pivotal base along an axis parallel to and offset from a pivot axis of said pivotal base.

4. The device according to claim 3, wherein said actuating mechanism comprises a common gear ring in meshing engagement with gear teeth formed on each pivotal base.

5. The device according to claim 4, wherein said damping mechanism is connected to the common gear ring and a body of said device so as to damp relative motion therebetween.

6. The device according to claim 1, wherein said damping mechanism comprises a housing affixed to a body of said device and a rod projecting from said housing and urged outwardly from said housing, the rod being positioned so as to contact said actuating mechanism, such that relative motion in a first direction between the body and the actuating mechanism forces the rod inwardly of the housing against the action of a bias-exerting mechanism of said actuating mechanism.

7. The device according to claim 6, wherein the bias-exerting mechanism is a coil spring.

8. The device according to claim 6, wherein the bias-exerting mechanism is an elastic strip or membrane.

9. The device according to claim 1, wherein the damping mechanism is configured such that the clamping elements have a closing velocity not greater than 1 cm/s (0.01 m/s).

10. The device according to claim 1, wherein the damping mechanism comprises a linear dashpot having a damping coefficient (force per velocity) in the range of 2-200 Ns/m.

11. The device according to claim 1, wherein the damping mechanism comprises a rotary dashpot having a damping coefficient (torque per angular velocity) in the range of 0.07-7 Nms/rad.

12. The device according to claim 4, wherein the damping mechanism is configured such that the overall damping coefficient acting on the common gear ring is in the range of 0.07-7 Nms/rad (torque per angular velocity).

13. A device for holding a wafer-shaped article, comprising clamping elements adapted to contact a peripheral edge of a wafer-shaped article, said clamping elements being biased toward a closed position by an actuating mechanism that engages said clamping elements, and at least one damping mechanism configured to contact said actuating mechanism as said clamping elements are moved toward said closed position, thereby to control a force with which said clamping elements impact the wafer edge when moving to the closed position, and wherein said actuating mechanism comprises a ring gear that drives said clamping elements.

14. The device according to claim 1, wherein said device is a spin chuck in a process module for single wafer wet processing.

15. The device according to claim 1, wherein said actuating mechanism comprises a ring gear that drives said clamping elements.

16. The device according to claim 2, wherein the clamping elements are a series of pins that are conjointly movable from an outer open position in which the pins do not contact a wafer-shaped article to said closed position.

17. The device according to claim 2, wherein said actuating mechanism comprises a ring gear that drives said clamping elements.

18. The device according to claim 13, wherein the clamping elements are a series of pins that are conjointly movable from an outer open position in which the pins do not contact a wafer-shaped article to said closed position.

19. The device according to claim 13, wherein said device is a spin chuck in a process module for single wafer wet processing.

\* \* \* \* \*